US006108610A

United States Patent [19]

Winn

[11] Patent Number: 6,108,610

[45] Date of Patent: Aug. 22, 2000

[54] METHOD AND SYSTEM FOR UPDATING NOISE ESTIMATES DURING PAUSES IN AN INFORMATION SIGNAL

[75] Inventor: Steve Winn, Red Lion, Pa.

[73] Assignee: Noise Cancellation Technologies, Inc., Linthicum, Md.

[21] Appl. No.: 09/170,594

[22] Filed: Oct. 13, 1998

[51] Int. Cl.$^7$ .................................................... G01R 23/00

[52] U.S. Cl. ................................ 702/77; 702/75; 702/76; 704/226; 704/228; 704/205; 704/210

[58] Field of Search ........................... 702/57, 60, 66–77, 702/79, 106, 111, 193, 124, 126, 185, 189–191, 195, 197, 198, FOR 103, FOR 104, FOR 107, FOR 108, FOR 110, FOR 166, FOR 167–FOR 169; 704/226, 208, 205, 210, 228, 227, 229, 225, 203, 233, 234; 381/317, 318, 320, 93, 98, 94.1–94.3; 708/322, 323, 309, 311; 324/76, 19, 21, 22, 76.24, 613, 614; 375/232–234

[56] References Cited

U.S. PATENT DOCUMENTS

| | | | |
|---|---|---|---|
| 3,403,224 | 9/1968 | Schroeder | 704/226 |
| 3,431,355 | 3/1969 | Rothauser et al. | 704/208 |
| 3,855,423 | 12/1974 | Brendzel et al. | 708/323 |
| 4,000,369 | 12/1976 | Paul, Jr. et al. | 704/228 |
| 4,025,721 | 5/1977 | Graupe et al. | 704/227 |
| 4,185,168 | 1/1980 | Graupe et al. | 381/318 |
| 5,012,519 | 4/1991 | Adlersberg et al. | 704/226 |
| 5,706,394 | 1/1998 | Wynn | 704/226 |
| 5,768,473 | 6/1998 | Eatwell et al. | 704/228 |
| 5,819,218 | 10/1998 | Hayata et al. | 704/233 |
| 5,963,901 | 10/1999 | Vähätalo et al. | 704/227 |
| 5,991,718 | 11/1999 | Malah | 704/226 |

OTHER PUBLICATIONS

Ephraim Y. and Malah D., *Speech Enhancement Using a Minimum Mean–Square Error Short–Time Spectral Amplitude Estimator*, IEEE Transactions on Acoustics, Speech, And Signal Processing, vol. ASSP–32, No. 6, Dec. 1994, pp. 1109–1121.

Boll Steven F., *Suppression of Acoustic Noise in Speech Using Spectral Subtraction*, IEEE Transactions on Acoustics, Speech, and Signal Processing, vol. ASSP–27, No. 2, Apr. 1979, pp. 113–120.

Weiss Mark H., et al., *Processing Speech Signals To Attenuate Interface*, IEEE Symposium on Speech Recognition, Apr. 1974, pp. 292–295.

*Primary Examiner*—Hal Wachsman
*Attorney, Agent, or Firm*—Michelle Larson

[57] ABSTRACT

The invention relates to an improved adaptive spectral estimator for estimating the spectral components in a signal containing both an information signal, such as speech, and noise. A method and system provide for generating noise estimates and then only updating the noise estimates during pauses in an information signal, when speech or other information is not detected, rather than continuously updating the noise estimates. A noise estimate is calculated for each frequency band and provides for the inclusion of a variable mathematical factor that can be set by the user to produce the best sound quality.

16 Claims, 9 Drawing Sheets

METHOD AND SYSTEM FOR UPDATING NOISE ESTIMATES DURING PAUSES IN AN INFORMATION SIGNAL

FIELD OF THE INVENTION

This invention relates to a method and system for improving Adaptive Speech Filter (ASF) estimates of the noise component of complex signals that contain both the information signal and noise. The present invention generates noise estimates that are updated only during pauses of the information signal. This produces an increase in processing speed and a decrease in system memory. The methods of the present invention are particularly suited to implementation on inexpensive digital signal processors.

BACKGROUND OF THE INVENTION

The spectral components of an information signal are used in a number of signal processing systems including channel vocoders for communication of speech, speech recognition systems and signal enhancement filters. Since the inputs to these systems are often contaminated by noise there has been a great deal of interest in noise reduction techniques and consequently noise estimation techniques. The effect of uncorrelated noise is to add a random component to the power in each frequency band, and the subject of accurately assessing the noise content is crucial to achieve the desired end result, which is the elimination of noise from the complex signal.

Noise-free spectral components are required for optimum operation of channel vocoders. In a vocoder the input signal is filtered into a number of different frequency bands and the signal from each band is rectified (squared) and smoothed (low pass filtered). The smoothing process tends to reduce the variance of the noise. Such methods are disclosed in U.S. Pat. No. 3,431,355 to Rothauser et al and U.S. Pat. No. 3,431,355 to Schroeder. An alternative approach is disclosed in U.S. Pat. No. 3,855,423 to Brendzel et al. In this approach the level of the noise in each band is estimated from successive minima of the energy in that band and the level of the signal is estimated from successive maxima. In U.S. Pat. No. 4,000,369 to Paul et al, the noise levels are estimated in a similar fashion and subtracted from the input signals to obtain a better estimate of the speech signal in each band. This method reduces the mean value of the noise.

Another application of spectral processing is for speech filtering. Weiss et al., in "Processing Speech Signals to Attenuate Interference", presented at the IEEE Symp. Speech Recognition, April 1974, disclose a spectral shaping technique. This technique uses frequency domain processing and describes two approaches—amplitude modulation (which is equivalent to gain control) and amplitude clipping (which is equivalent to a technique called spectral subtraction). Neither the noise estimate nor the speech estimate is updated so this filter is not adaptive. An output time waveform is obtained by recombining the spectral estimates with the original phases.

An adaptive speech filter is disclosed in U.S. Pat. No 4,185,168 to Graupe and Causey, which is included by reference herein. Graupe and Causey describe a method for the adaptive filtering of a noisy speech signal based on the assumption that the noise has relatively stationary statistics compared to the speech signal.

In Graupe and Causey's method the input signal is divided into a set of signals limited to different frequency bands. The signal to noise ratio for each signal is then estimated in accordance with the time-wise variations of it's absolute value. The gain of each signal is then controlled according to an estimate of the signal to noise ratio (the gain typically being close to unity for high signal to noise ratio and less than unity for low signal to noise ratio).

Graupe and Causey describe a particular method for estimating the noise power from successive minima in the signals, and describe several methods for determining the gain as a function of the estimated noise and signal powers. This is an alternative to the method described earlier in U.S. Pat. No. 4,025,721 to Graupe and Causey, which detects the pauses between utterances in the input speech signal and updates estimates of the noise parameters during these pauses. In U.S. Pat. No. 4,025,721, Graupe and Causey describe the use of Wiener and Kalman filters to reduce the noise. These filters can be implemented in the time domain or the frequency domain.

Boll, in "Suppression of Acoustic Noise in Speech using Spectral Subtraction", IEEE Transactions on Acoustics, Speech and Signal Processing. Vol. ASSP-27, No. 2, April, 1979, describes a computationally more efficient way of doing spectral subtraction. In the spectral subtraction technique, used by Paul, Weiss and Boll, a constant or slowly varying estimate of the noise spectrum is subtracted. However, successive measurements of the noise power in each frequency bin vary rapidly and only the mean level of the noise is reduced by spectral subtraction. The residual noise will depend upon the variance of the noise power. This is true also of Weiss's spectral shaping technique where the spectral gains are constant. In Graupe's method the gain applied to each bin is continuously varied so that both the variance and the mean level of the noise can be reduced.

There are many schemes for determining the spectral gains. One scheme is described by Ephraim and Malal in "Speech enhancement using a minimum mean-square error short-time spectral amplitude estimator", IEEE Transactions on Acoustics, Speech and Signal Processing, Vol. ASSP-32, No. 6,December 1984. This describes a technique for obtaining two estimates of the signal to noise ratio—one from the input signal and one from the output signal. It does not update the estimate of the noise level. The gain is a complicated mathematical function of these two estimates, so this method is not suitable for direct implementation on a digital processor.

In U.S. Pat. No. 5,012,519 to Aldersburg et al the gain estimation technique of Ephraim and Malah is combined with the noise parameter estimation method disclosed in U.S. Pat. No. 4,025,721 to Graupe and Causey to provide a fully adaptive system. The mathematical function of Ephraim and Malah is replaced with a two-dimensional lookup table to determine the gains. However, since the estimates of the signal to noise ratio can vary over a very large range, this table requires a large amount of expensive processor time and memory. Aldersburg et al use a separate voice detection system on the input signal which requires significant additional processing time.

There is thus an unmet need in the art to be able to utilize an efficient adaptive signal processing technique for the accurate and fast identification of noise. Processing time and memory efficiency would be improved if the noise estimates were only done during pauses of the information signal, so that noise estimates arc updated only when an information signal is not detected. The algorithm should be capable of being implemented on inexpensive digital signal processors.

SUMMARY OF THE INVENTION

It is an object of the present invention to be able to obtain and update noise estimates only during pauses of the information signal, thereby decreasing processing time and memory requirements.

Therefore, according to the present invention, a method and system provide for noise estimates to be updated only during pauses in an information signal, when speech or other information is not detected, rather than continuously updating the noise estimates. Waiting for pauses in the information signal before updating the noise estimates allows processing time and memory requirements to be decreased. It also allows adaptive speech filtering to be easily implemented on inexpensive digital signal processors.

According to the method of the present invention, after a set of input frequency components have been produced, the total power calculated for each input frequency component, the power of the information signal estimated, a modified gain of the information signal calculated, and the input frequency component multiplied by the modified gain to produce an estimate of the power of the frequency component, then an estimate of the noise power is updated only if a pause in the information signal has been detected. Detecting a pause in the information signal is accomplished by first determining whether the estimate of the power of the frequency component of the information signal exceeds a first predetermined threshold value at each frequency. If the estimate of the power does exceed the first predetermined threshold value, then a threshold value thrsholdCnt[f] is checked to determine if it exceeds a second predetermined threshold value. If the threshold value does exceed the second predetermined threshold value, then a pause has been detected. If the threshold value does not exceed the second predetermined threshold value, then no pause has been detected. In this instance, the noise estimate is not updated and instead the threshold value thrsholdcnt[f] is incremented.

The foregoing method of the present invention is implemented by a system for estimating the noise power of frequency components of an information signal from an input signal containing both the information signal and noise. The system has means to produce input frequency components, one frequency component for each frequency band, a first calculating means for calculating the total power of each input frequency component, a second calculating means for calculating the modified gain of each frequency band, and a gain multiplying means for multiplying the input frequency component by the gain to produce an estimate of the power of the frequency component of the information signal. The system additionally has an estimating means that estimates the power of the information signal and updates the estimate of the noise power only during a pause detected in the information signal by the estimating means. The estimating means itself has an adder, a first comparison element coupled to the adder that receives the estimate of the power of the information signal and a first predetermined threshold value from the adder and determines whether the estimate of the power of the information signal exceeds the first predetermined threshold value, and a second comparison element coupled to the first comparison element that determines whether a threshold value exceeds a second predetermined threshold value if the estimate of the power of the information signal exceeds the first predetermined threshold value. The estimate of the noise power is updated if the threshold value exceeds the second predetermined threshold value since this condition is indicative of a pause detected in the information signal. If a pause is not detected then an increment element increments the threshold value.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
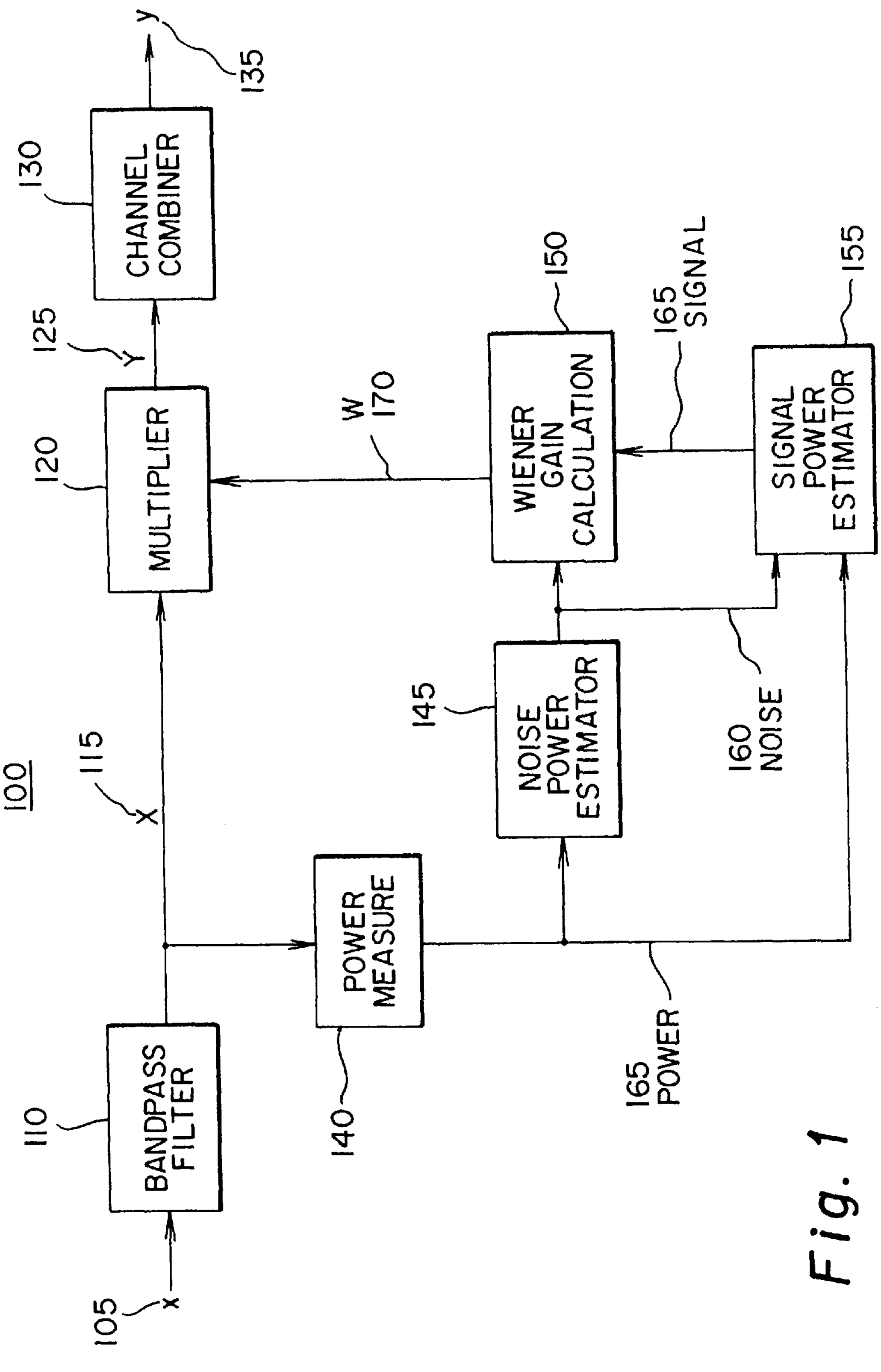
Fig. 1 PRIOR ART
FIG. 1 is a block diagram of a prior art system.

The present invention describes a method for generating noise estimates which are only updated when an information signal, such as speech, is not detected. The noise estimate is calculated for each frequency band, and provides for the inclusion of a variable mathematical factor that can be set by the user in order to produce the best sound quality. The noise estimate method of the present invention allows the adaptive speech filter algorithm to perform better under all conditions.

The adaptive speech filtering of the present invention is a modified version of that described in U.S. Pat. No. 4,185,168 to Graupe and Causey which describes a method for the adaptive filtering of a noisy speech signal. The method is based on the assumption that the noise has relatively stationary statistics compared to the speech signal.

The input to the filter is usually a digital signal obtained by passing an analog signal, containing noise and the information signal, through high- and low-pass filters and then sampling the resulting signal at a sample rate of at least 8 kHz. The high pass filter is designed to remove low frequency noise that might adversely affect the dynamic range of the filter. The turnover frequency of the high pass filter is less then f_low, where f_low is the lower limit of the speech band in Hertz. The low pass filter is an anti-aliasing filter, which has a turnover frequency of at least f_high , where f_high is the upper limit of the speech band in Hertz. The order of the low pass filter is determined by the sampling frequency and the need to prevent aliasing.

The output signal is calculated by filtering the input signal using a frequency domain filter with real coefficients and may be a time series or a set of spectral estimates. If the output is a time series then it may be passed to a digital to analog converter (DAC) and an analog anti-imaging filter to produce an analog output signal or it may be used as an input to subsequent signal processing.

The estimator of the spectral components comprises four basic steps:

1. Calculation of the spectrum of the input signal.
2. Estimation of the signal and noise power in each frequency bin within the speech band (f_low→f_high Hz).
3. Calculation of the gains (coefficients) of the frequency domain filter for each frequency bin, and
4. Calculation of the spectral estimates by multiplying each input spectral component by the corresponding gain.

This is basically the method of Graupe and Causey, and each of the processes is discussed below.

The estimates of the noise are updated during pauses in the information signal. These pauses are detected by looking at the power estimate to see if it exceeds a predetermined threshold, noise threshold, multiplied by noise[f] at each frequency. If the power estimate is above the calculated threshold then a thrsholdCnt[f] is checked to see if it exceeds a predetermined value update_delay.

The spectral components of the input signal can be obtained by a variety of means, including band pass filtering and Fourier transformation. In one approach a discrete or fast Fourier transform is used to transform sequential blocks of N points of the input time series. A window function, such as a Hanning window, can be applied, in which case an overlap of N/2 points can be used. A Discrete Fourier Transform (DFT) can be used at each frequency bin in the speech band or, alternatively, a Fast Fourier Transform (FFT) can be used over the whole frequency band. The spectrum is stored for each frequency bin within the speech band. For some applications it is desirable to have unequally spaced frequencies—in these applications a Fast Fourier transform cannot be used and each component may have to be calculated independently. In one approach the input spectrum, X, is calculated as the Fourier transform of the input time series, x, namely X=Fourier transform {x, window function, N}.

The power in the input spectrum is given by power=modulus squared {X}.

Alternatively, a band pass filter may be used, in which case the power may be estimated by rectifying and smoothing the filter output. This version of a Graupe and Causey system is shown in FIG. 1, Block Diagram 100. Input Time Signal 105, x, is applied to a bank of band pass filters. One of these bandpass filters is represented by Bandpass Filter 110 in FIG. 1. The output of Bandpass Filter 110 is Input Spectral Signal 115, referred to as X. The power of Input Spectral Signal 115 is measured by Input Spectral Signal Power Measurement 140, which generates Total Input Spectral Power Signal 165. The method requires that estimates be made for both Total Input Spectral Power Signal 165 and Noise Power Estimator Output 160. Noise Power Estimator Output 160 is generated by Noise Power Estimator 145 which utilizes a time constant related to the time over which the noise content of Total Input Spectral Power Signal 165 can be considered stationary. Total Input Spectral Power Signal 165 is estimated by Signal Power Estimator 155. From these estimates Wiener Gain Coefficients 170 is calculated by Wiener Gain Calculator 150, Wiener Gain Calculator 150 determines the ratio of the power in the information signal, which is Total Input Spectral Power Signal 165, to the total power which is the sum of Noise Power Estimator Output 160 and Total Input Spectral Power Signal 165. For each frequency bin this is W=signal/(noise+signal).

In the method of Graupe and Causey the Wiener gain, W, is directly applied to the corresponding component of the input spectrum. In the unmodified scheme the spectral components of the output are given by multiplying Input Spectral Signal 115 by Wiener Gain Coefficients 170 in Multiplier 120. The result is

Y=W*X which is Output Spectral Signal 125. If Output Time Signal 135, y, is required it can be calculated by an inverse FFT (or DFT) and the 'overlap-add' method or by summing the components from individual channels using Channel Combiner 130.

After each iteration k the output block of N time points is updated as $$y_k(1:N)=\text{inverse Fourier transform }\{Y,N\}$$

$$y_k(1:N/2)=y_k(1:N/2)+y_{k-1}(N/2+1:N)$$

The first N/2 points of $y_k$ are then sent to Channel Combiner 130 or may be used for further processing.

Figure 2:
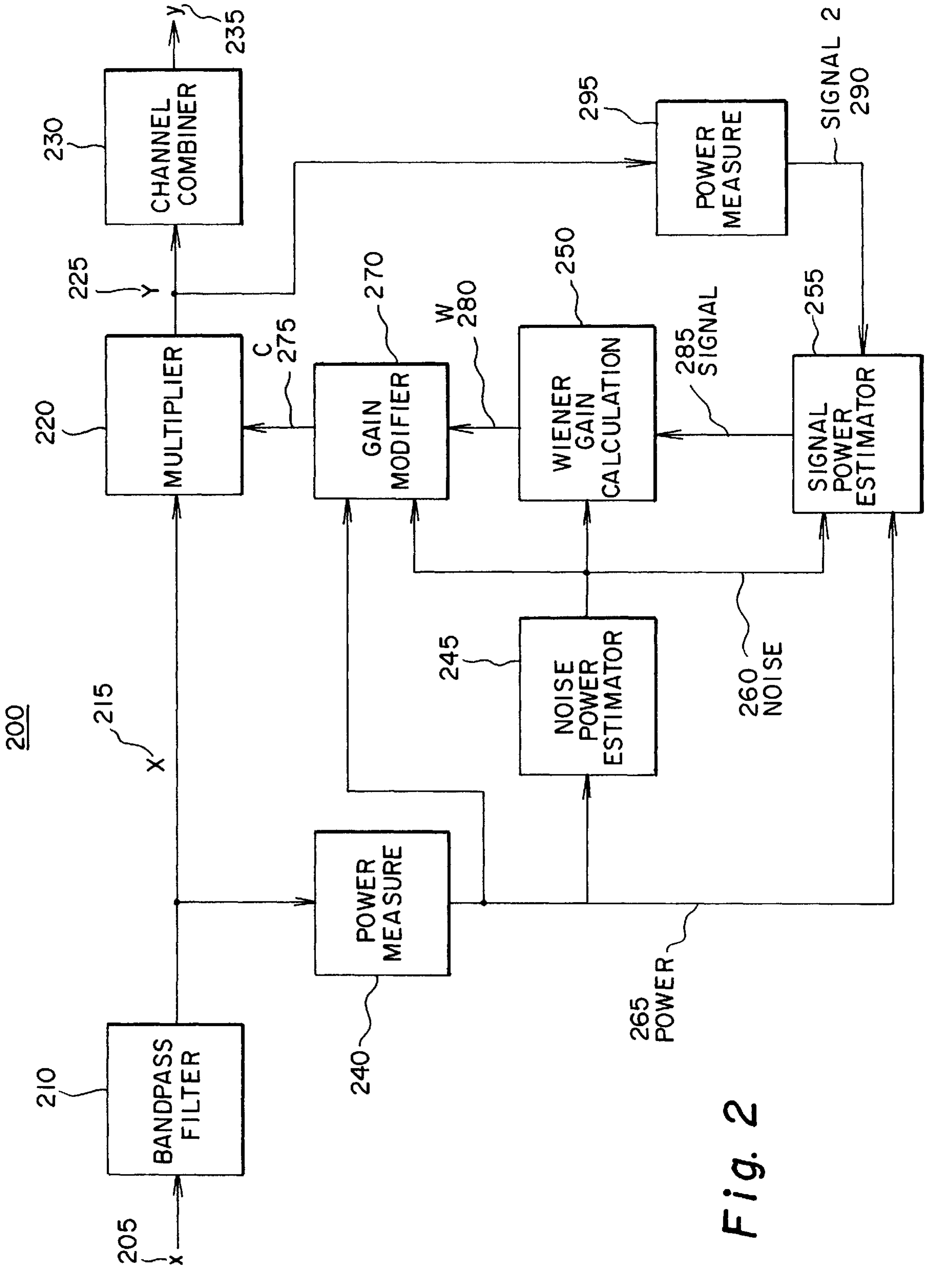
FIG. 2 is a block diagram of a typical system of the present invention.

An improved system is shown in FIG. 2, Block Diagram 200. The additional features are described below.

Gain Modification

Time Input Signal 205 is applied to Bandpass Filter 210. The output of Bandpass Filter 210 is applied to the input of Multiplier 220, and if a time signal output is desired Channel Combiner 230 is utilized to generate Time Output Signal 235. When the signal to noise ratio is low the direct use of the Wiener gain results in a residual noise which has a musical or artificial character. One improvement is the use of Gain Modifier 270, which reduces the musical nature of the residual noise. Gain Modifier 270 receives inputs from Wiener Gain Calculation 250 and Noise Power Estimator 245. The output of Total Input Spectral Power Measurement 240 is also routed as an input to Gain Modifier 270.

Figure 3:
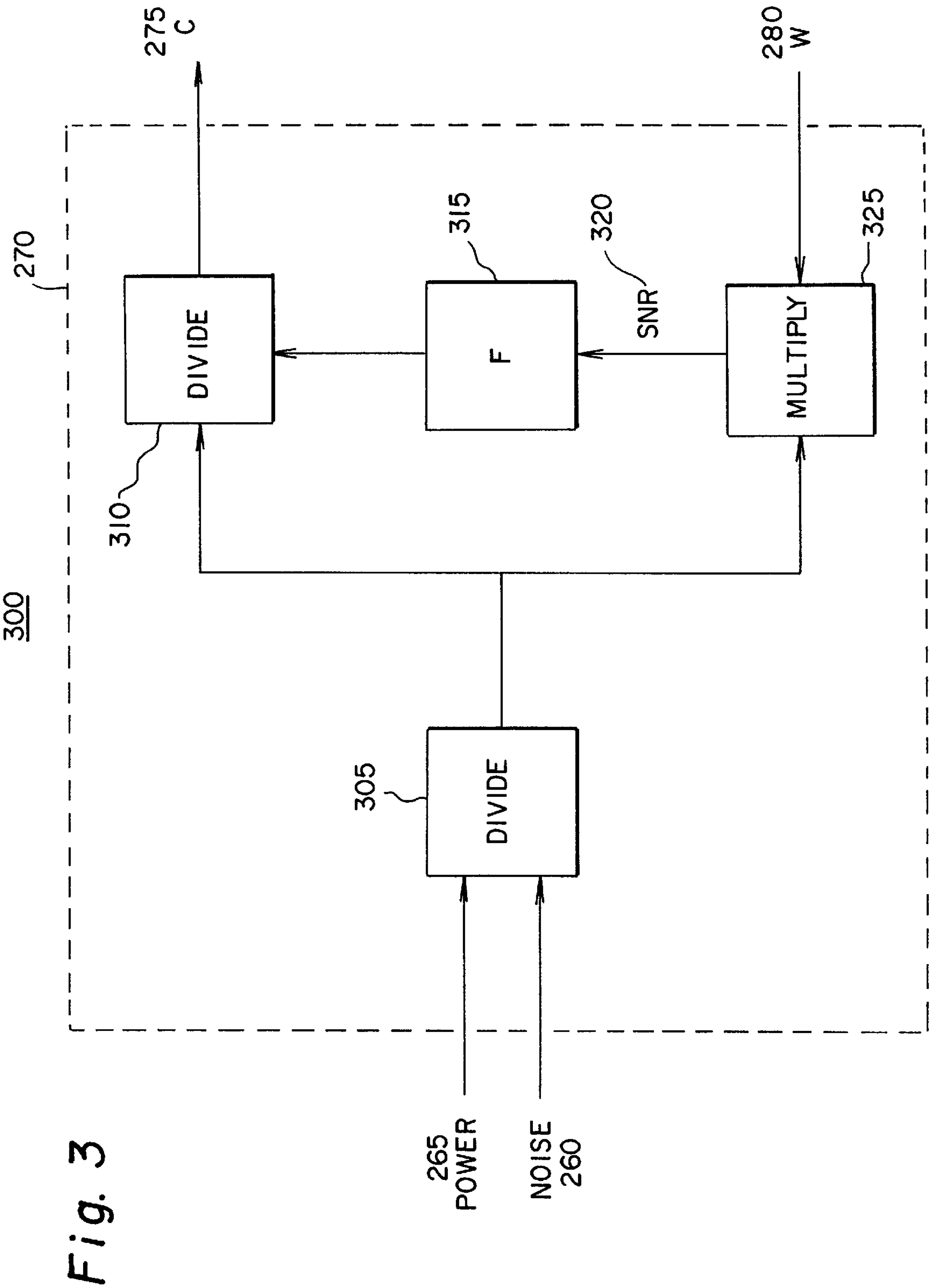
FIG. 3 is a block diagram of a sub-system for gain modification, according to the present invention.

Gain Modifier 270 is presented by FIG. 3, Block Diagram 300. The instantaneous power of the information signal can be estimated as the product of the instantaneous power and the Wiener gain. This gives an estimate of the instantaneous signal to noise ratio, snr, in each frequency bin obtained by dividing Total Input Spectral Power 265 by Noise Power Estimator Output 260, which is accomplished by Divider 305, and using this quotient to modulate or multiply Wiener Gain Coefficients 280. This is accomplished by Multiplier 325, and the output of Multiplier 325 is Signal-to-Noise Ratio Estimate 320. Hence snr=W*(power/noise).

A function of the signal to noise ratio is then calculated by Function Modifier 315, and Modified Coefficients 275, which are denoted by the vector C, are calculated by dividing the output of Function Modifier 315 by the output of Divider 305. This is accomplished by Divider 310 and is done for each frequency, so that C=F{snr}*(noise/power)=F{snr}/(power/noise)

where F is a function of a single variable and is therefore well suited to implementation on a DSP as a look-up table or an analytic function. One form of the function F is given by $$F(x) = \begin{cases} x^{1/2}, & x < snr0 \\ x + c, & x \geq snr0. \end{cases}$$

where c and snr0 are constants. Other forms can used, but it is desirable that the function is approximately linear at high signal to noise ratios. In particular the gain of Ephraim and Malah may be manipulated so that it can be implemented in this form.

Output Spectral Signal 225, Y, which is the estimate of the spectrum of the information signal, is calculated by multiplying 215 by the corresponding Modified Coefficients 275, as shown in FIG. 2, so that for each frequency

Y=C*X

Signal Estimation

Figure 4:
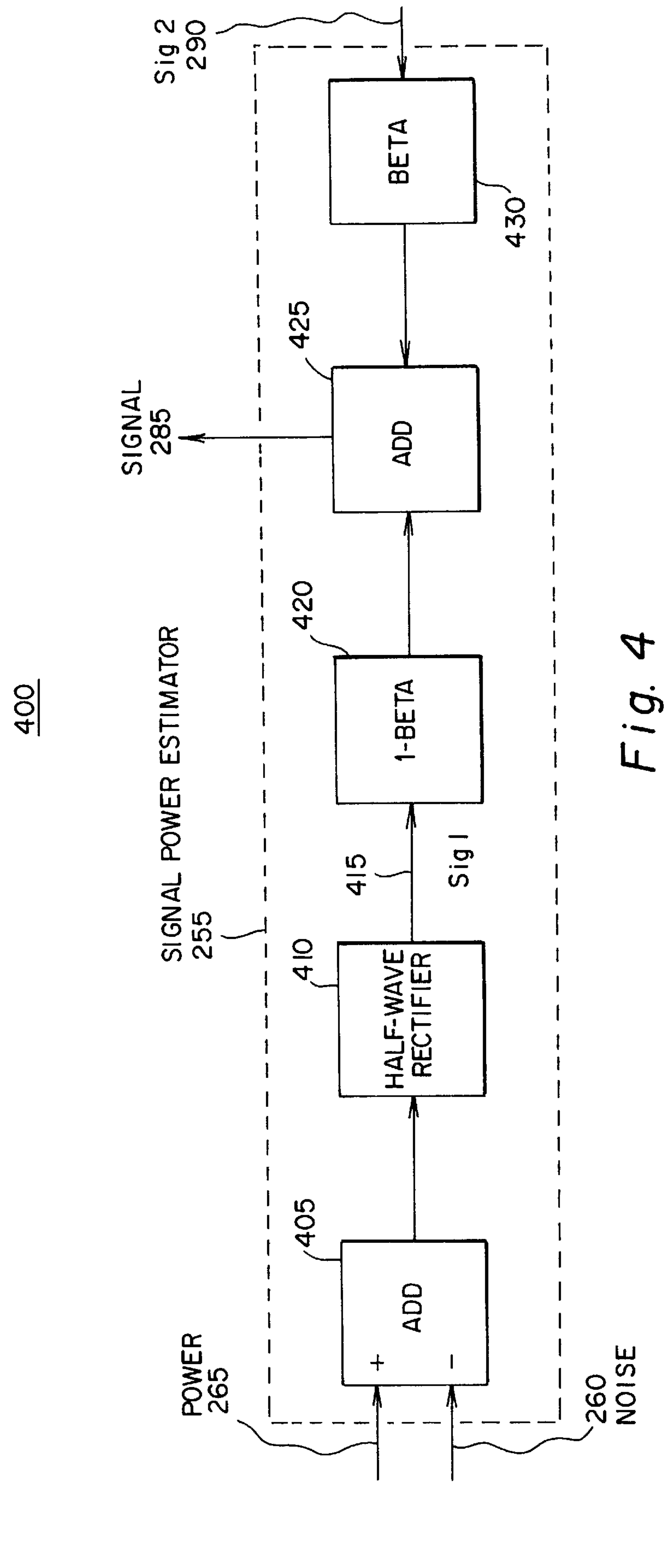
FIG. 4 is a block diagram of a sub-system for signal power estimation, according to the present invention.

Ephraim and Malah in "Speech enhancement using a minimum mean-square error short-time spectral amplitude estimator", IEEE Transactions on Acoustics, Speech and Signal Processing, Vol. ASSP-32, No. 6, December 1984, pages 1109–1121, describe a method for updating a signal to noise ratio. This method can be modified to give an estimate of Signal Power Estimator Output 285. Signal Power Estimator 255 uses the power in the output spectral signal Output Spectral Signal Power 290 which is calculated by Output Spectral Signal Power Measurement 295 as shown in FIG. 2. The method is shown in detail in FIG. 4, Block Diagram 400, and is given by sig1=maximum{power−noise,0} sig2=modulus squared{Y} signal=(1−beta)*sig1+beta*sig2

The difference between Total Input Spectral Power 265 and Noise Power Estimator Output 260 is calculated by Adder 405. The output of Adder 405 is half-wave rectified by Half-wave Rectifier 410. The output of Half-wave Rectifier 410 is Half-wave Rectifier Output Signal 415, and Half-wave Rectifier Output Signal 415 is weighted by (1-Beta) Weighting Function 420. Signal Power Estimator Output 285 is obtained as the sum of the output of (1-Beta) Weighting Function 420 and the output of (Beta) Weighting Function 430 by Adder 425. The output of (Beta) Weighting Function 430 is a weighted value of Output Spectral Signal Power 290. The weighting parameter beta used in the weighted sum is typically chosen to be greater than 0.9 and less than 1.

Noise Estimation

The estimates of the noise can be updated during the pauses in the information signal. The pauses can be detected by looking at the power estimate to see if it exceeds a predetermined threshold, noise threshold multiplied by noise [f] at each frequency. If the power estimate is above the calculated threshold then a thrsholdCnt[f] is checked to see if it exceeds a predetermined value update_delay. If it does, the noise estimate is updated as Noise[f]=alpha*power+(1-alpha)*noise[f]

Noise[f]=maximum {noise[f], minNoise}

ThrsholdCnt[f]=0

MinNoise is a constant that prevents noise[f] from being equal to zero. It is typically equal to 1*10exp−7.

If a pause is not detected, thrsholdCnt[f] is incremented

ThrsholdCnt[f]=thrsholdCnt[f]+1

Figure 5:
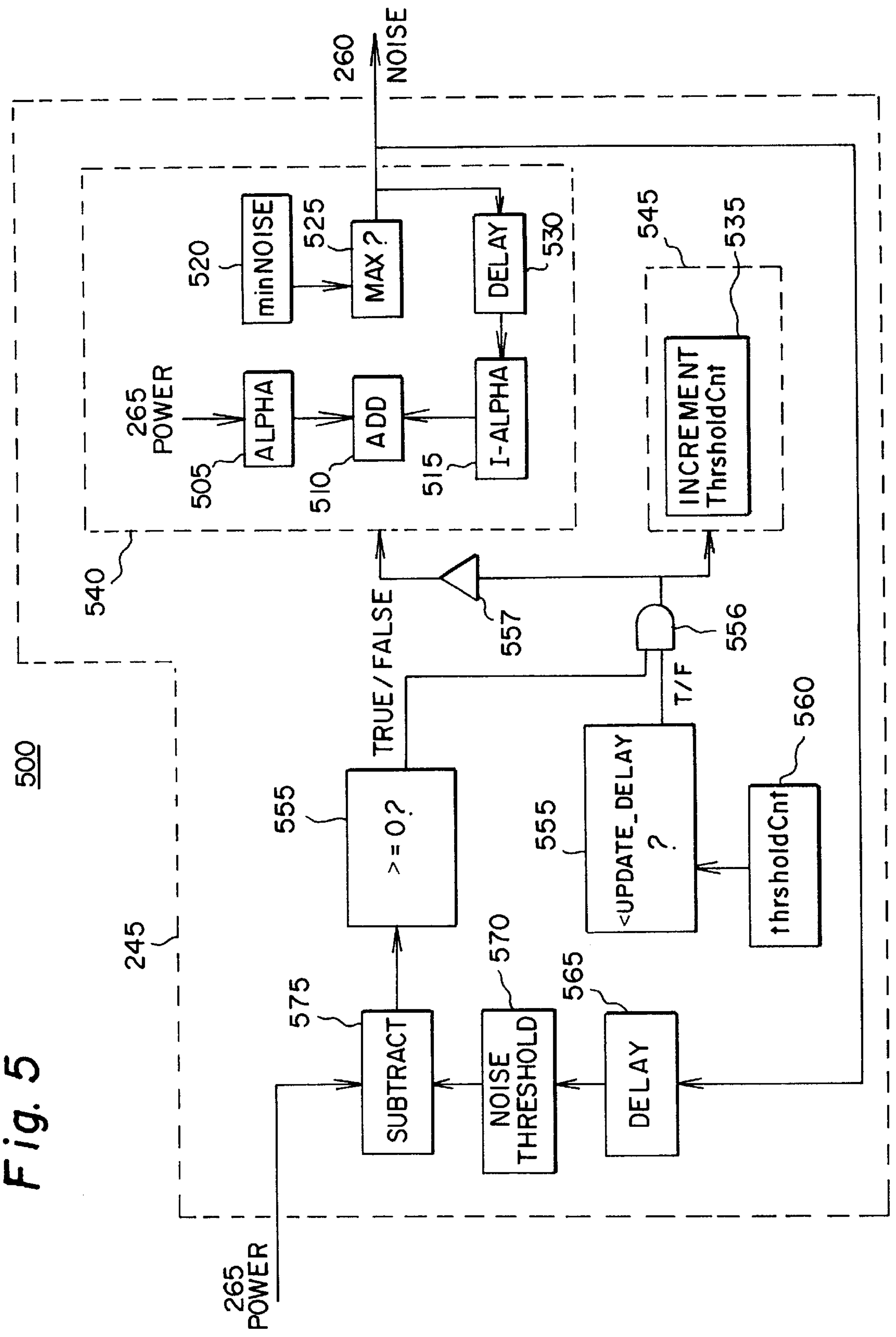
FIG. 5 is a block diagram of a sub-system for noise power estimation, according to the present invention.

This type of noise estimator is depicted in FIG. 5, Block Diagram 500. Input Spectral Power 265 is applied to a first input of Adder 575. Noise Power Estimator Output 260 is applied to the input of Time Delay 565. Time Delay 565 functions as a one-sample delay. The output of Time Delay 565 is multiplied by a constant, Noise Threshold, in Noise Threshold Multiplier 570. The output of Noise Threshold Multiplier 570 is routed to a second input of Adder 575. The output of Adder 575 is input to (>=0?) Function 550. The inputs of the logical AND 556 enables Algorithmic Process 545 only if Function 550 and Function 555 are true. If the output of function 556 is False Algorithmic Process 545 is disabled. The output of Logical AND 556 is applied to the input of Inverter 557. A false input at Inverter 557 will enable Algorithmic Process 540.

The sequence of First Algorithmic Process 540 will now be described. Input Spectral Power 265 is input to (alpha) Multiplier 505. The output of (alpha) Multiplier 505 is applied to a first input of Adder 510. The output of Adder 510 is an input to Multiplier 525. Time Delay 520 is a one sample delay. The output of Multiplier 525 is Noise Power Estimator Output 260. Noise Power Estimator Output 260 is applied to the input of Time Delay 565 and to the input of Time Delay 530. Time Delay 530 functions as a single sample delay. The output of Time Delay 530 is applied to the input of (1-alpha) Multiplier 515. The output of (1-alpha) Multiplier 515 is applied as a second input of Adder 510.

Second Algorithmic Process 545 produces an increment in the value of ThrsholdCnt, and is represented by (Increment thrsholdCnt) Function 535.

Information Signal Detector

Figure 6:
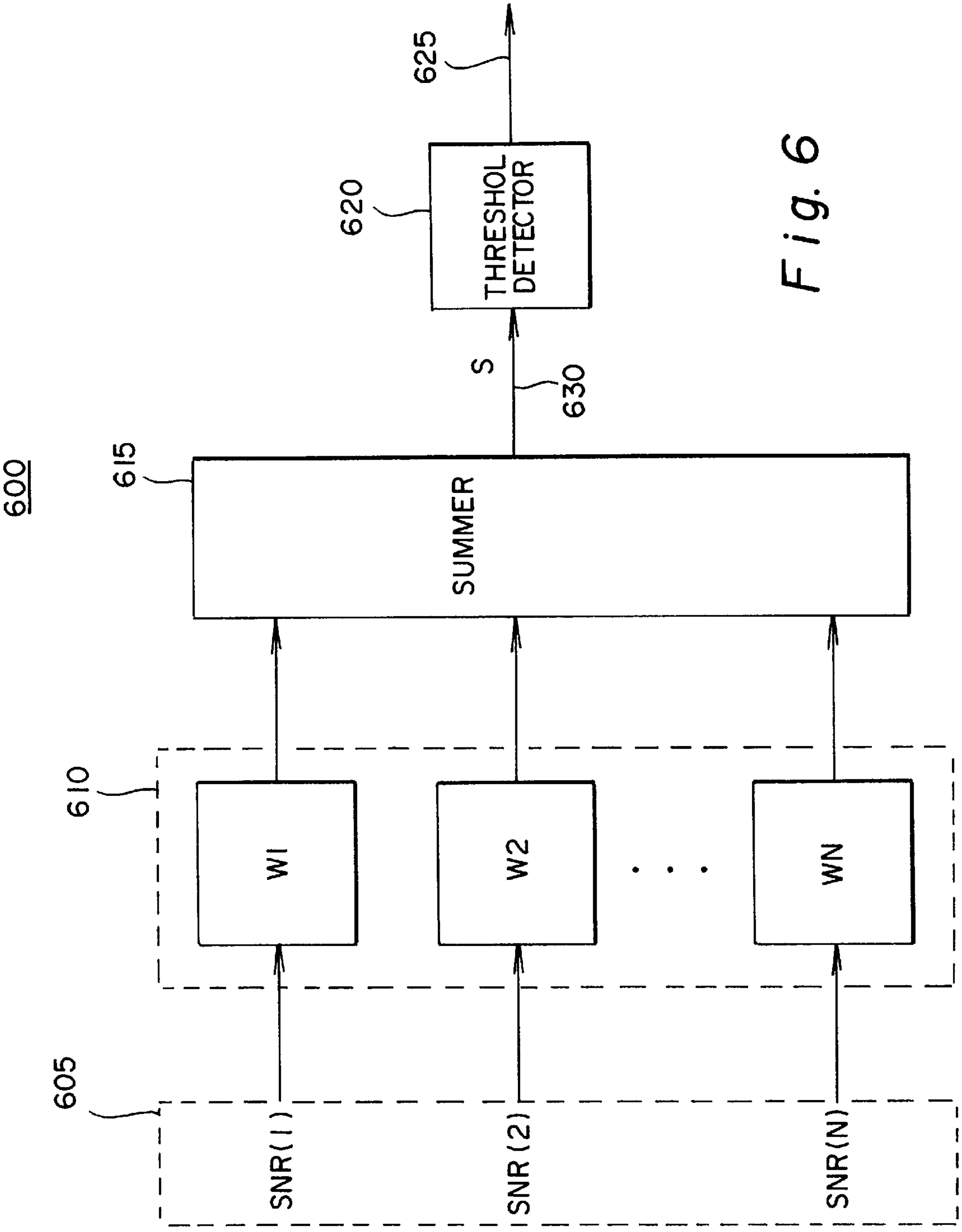
FIG. 6 is a block diagram of a sub-system for an information signal detector, according to the present invention.

The present invention operates to update estimates of the noise during pauses in the information signal. The presence of an information signal can be detected by looking at a weighted sum of the signal to noise components across frequency bins (a uniform weighting may be used). If this weighted sum is above a predetermined threshold, the signal is assumed to contain information and the noise estimate is updated. This is shown in FIG. 6, Block Diagram 600. Signal-to-Noise Ratio Estimates 605 are weighted by Signal-to-Noise Ratio Weighting Coefficients 610 and then summed by Summer 615 to produce Summer Output Signal 630, S, before being input to Threshold Detector 620. The output of Threshold Detector 620 is Threshold Detector Output Signal 625.

One algorithmic example is described below:

```
at each update number k
    X = Fourier transform { x, window function, N }.
    FOR each frequency number f in speech band
        power = modulus squared{ X[f] }
        sig1 = maximum{power - noise[f], 0}
        sig2 = modulus squared{Y[f]}
        signal = (1-beta) * sig1 + beta * sig2
        W = signal/( noise[f] + signal )
        snr = W * ( power/noise[f] )
        C = F{snr} / ( power/noise[f] )
    IF(power-noiseThreshold*noise[f]>=0 and thrsholdCnt<update_delay
        THEN thrsholdCnt[f]=thrsholdCnt[f]+1
        OTHERWISE noise[f]=alpha*power+(1-alpha)*noise[f]
            Noise[f]=max(noise[f], minNoise)
            ThrsholdCnt[f]=0
        ENDIF
        old_power[f] = power
```

-continued

```
        Y[f] = C * X[f]
    ENDFOR
yk(1:N) = inverse Fourier transform {Y,N}
yk(1:N/2) = yk(1:N/2) + yk-1(N/2+1:N)
```

At the end of each iteration, k, the signal $y_k(1{:}N/2)$ provides an estimate of the information signal. If a pause is not detected in the information signal, then thrsholdCnt[f] is incremented: thrsholdCnt[f]=thrsholdCnt[f]+1.

Figure 7:
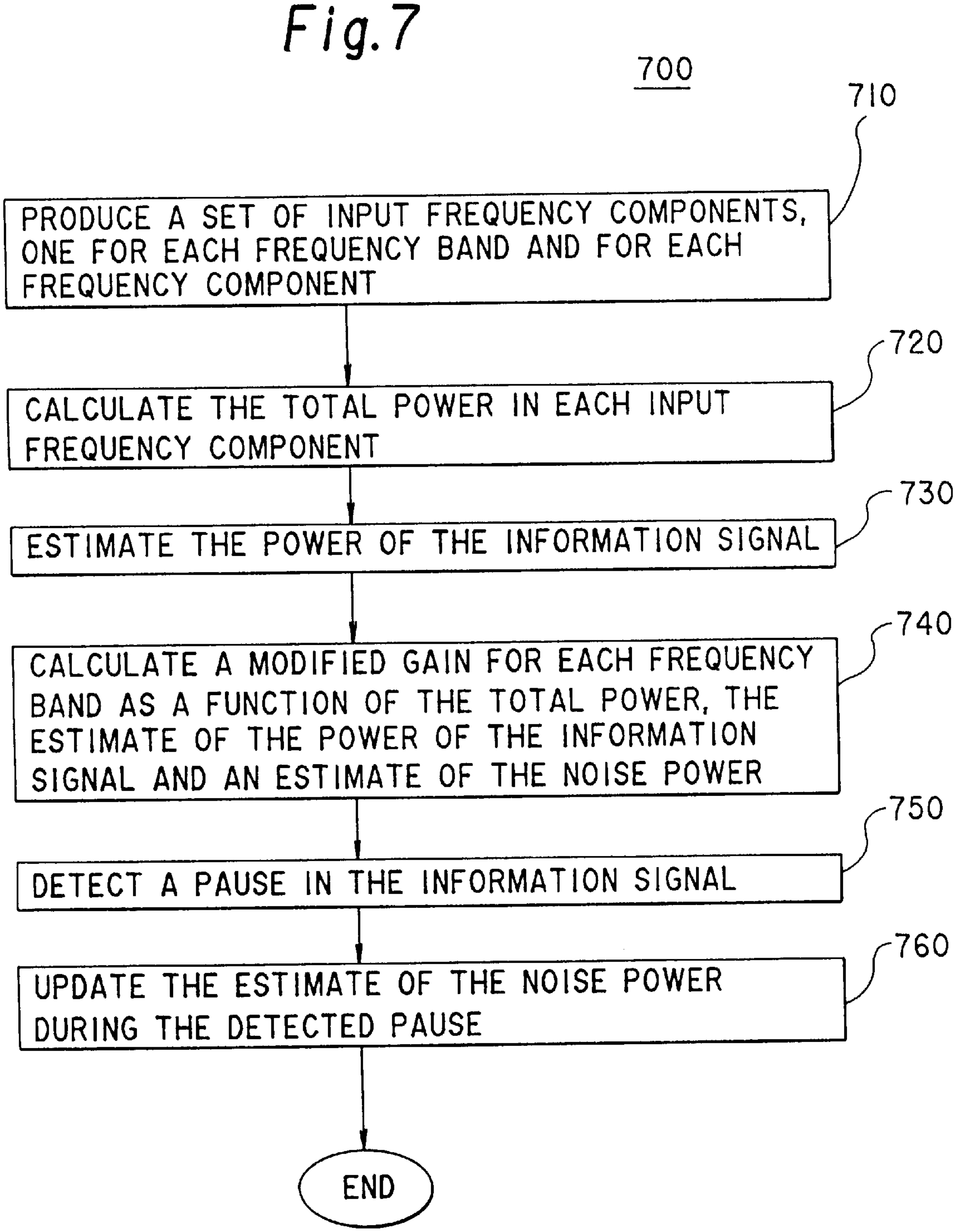
FIG. 7 is a flowchart of the overall methodology for estimating the frequency components of an information signal from an input signal containing both the information signal and noise and updating the estimate of noise power, according to the present invention.

The methodology of the present invention for estimating the frequency components of an information signal from an input signal containing both the information signal and noise may be further described by reference to FIGS. 7–9. Referring now to FIG. 7, flowchart 700 illustrates the overall methodology of the present invention. At Block 710, A set of input frequency components, one for each frequency band and for each frequency component is produced. At Block 720, the total power in each input frequency component is calculated. Next, the power of the information signal is estimated at Block 730. At Block 740, a modified gain for each frequency band is calculated as a function of the total power, the estimate of the power of the information signal and an estimate of the noise power. At Block 750, a pause is detected in the information signal. Finally, the estimate of the noise power is updated during the pause that is detected at Block 750.

Figure 8:
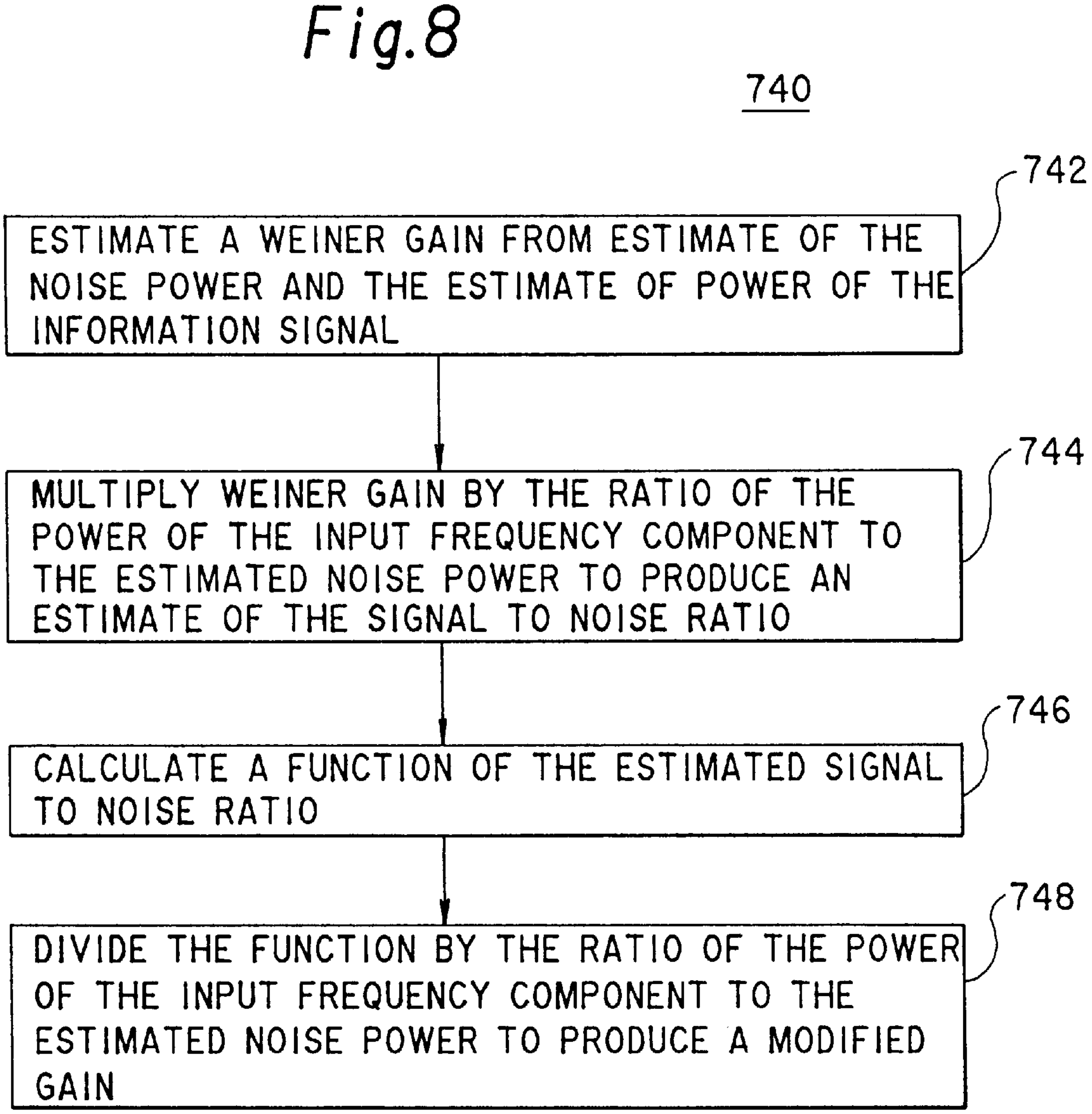
FIG. 8 is a flowchart of the methodology for calculating gain, according to the present invention.

The methodology for calculating gain is further illustrated in flowchart 740 of FIG. 8. In Block 742, a Weiner gain is estimated from the estimate of the noise power and the estimate of power of the information signal. Next, at Block 744, the Weiner gain is multiplied by the ratio of the power of the input frequency component to the estimated noise power to produce an estimate of the signal to noise ratio. At Block 746, a function of the estimated signal to noise ratio from Block 744 is calculated. Finally, at Block 748, the function of the estimated signal to noise ratio is divided by the ratio of the power of the input frequency component to the estimated noise power to produce a modified gain.

Figure 9:
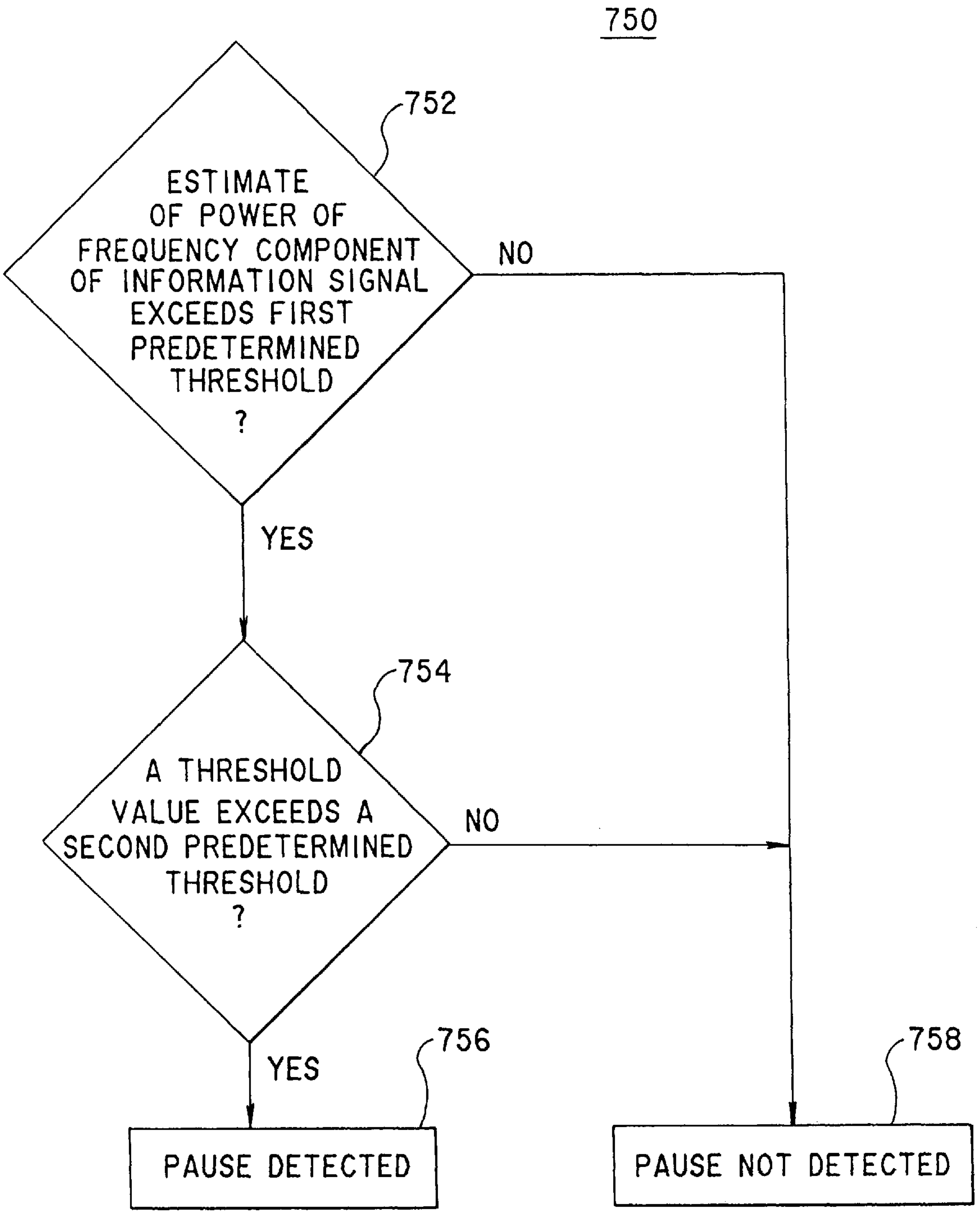
FIG. 9 is a flowchart of the methodology for detecting a pause, according to the present invention.

The methodology for detecting the pause of Block 750 of FIG. 7 is illustrated further in FIG. 9. First, at Decision Block 752, it must be determined whether the estimate of the power of the frequency component of the information signals exceeds a first predetermined threshold. If it does not, this is indicative that a pause has not been detected as shown at Block 758. If it does, on the other hand, then the inquiry at Decision Block 754 is whether a threshold value exceeds a second predetermined threshold. If it does, then a pause is detected as illustrated at Block 756. If it does not, then a pause has not been detected.

As can be seen from the foregoing description the present invention teaches a method whereby a noise estimate may be calculated and utilized in an adaptive speech filter algorithm. The noise estimation method generates noise estimates only during pauses in the information signal, rather than continuously updating the noise estimates. This noise estimation and updating technique allows for faster convergence and quicker cancellation of interfering tones than prior art techniques. The algorithmic technique can be implemented on inexpensive digital signal processors. It typically will result in less processing time, and memory requirements are less. The method of the present invention avoids corruption of the noise estimates due to additive information signal content that is common in other methods of noise estimation.

While the invention has been particularly shown and described with reference to a preferred embodiment, it will be understood by those skilled in the art that various changes in form and detail may be made therein without departing from the spirit and scope of the invention.

What is claimed is:

1. A method for estimating the power of frequency components of an information signal from an input signal containing both the information signal and noise and updating an estimation of noise power of the frequency components, said method comprising:

producing a set of frequency components of the information signal;

calculating the total power in each frequency component of the set of frequency components;

estimating the power of a previous noise reduced output;

calculating a gain for each frequency component as a function of the total power in each frequency component of the information signal, the estimated power of the previous noise reduced output and an estimate of a noise power of the noise;

multiplying each frequency component of the set of frequency components by a corresponding said gain to produce an estimate of the power of each frequency component of said information signal;

detecting a pause in the information signal, further comprising for each frequency component:

determining whether the total power in each frequency component of said information signal exceeds a first predetermined threshold, and if the total power in each frequency component of said information signal exceeds the first predetermined threshold, then determining whether a threshold value exceeds a second predetermined thresholds wherein the pause is detected if the threshold value exceeds the second predetermined threshold, and updating the estimate of the noise power during the pause detected in the information signal.

2. The method as in claim 1 wherein if the threshold value does not exceed the second predetermined threshold, then incrementing the threshold value.

3. The method as in claim 1, further comprising:

estimating an overall signal to noise ratio of the input signal from a weighted sum of an estimated signal to noise ratio of each frequency component of the set of frequency components.

4. The method as in claim 3 further comprising using said estimated overall signal to noise ratio to determine the presence of the information signal in the input signal.

5. The A method as in claim 1, further comprising combining the calculations of the total power of each frequency component of said set of frequency components of said information signal to produce a noise reduced output signal.

6. The method as in claim 1 in which the estimated power of the previous noise reduced output is estimated from a combination of a previous power estimate of a frequency component of the set of frequency components of said information signal and the positive difference between the total power in the frequency component and the estimate of the noise power.

7. The method as in claim 6, in which the gain in each frequency component of the set of frequency components is determined by:

estimating a Wiener gain from said estimate of the noise power and the estimated power of the previous noise reduced output;

multiplying said Wiener gain by the ratio of the total power of each frequency component of the information signal to the estimated noise power to produce an estimate of a signal to noise ratio of the frequency component;

calculating a function of the estimated signal to noise ratio; and dividing said function of the estimated signal to noise ratio by the ratio of the total power of each frequency component of the information signal to the estimated noise power to produce a modified gain.

8. The method as in claim 1 which is used for preprocessing the input signal prior to being provided to a speech or voice recognition system.

9. The method as in claim 1 which is used for reducing noise in the input signal provided to a communications system.

10. The method of claim 1 wherein producing the set of frequency components comprises filtering the input signal through a set of band pass filters.

11. The method of claim 1 wherein producing the set of frequency components comprises calculating the Fourier Transform of the input signal.

12. The system for estimating the noise power of frequency components of an information signal from an input signal containing both the information signal and noise, said system comprising:

means to produce a set of frequency components of the information signal;

a first calculating means for calculating the total power in each frequency component of the set of frequency components;

an estimating means for estimating the power of each frequency component of the information signal and for updating a previously made estimate of a noise power of the noise only during a pause detected in the information signal by the estimating means, wherein the estimating means comprises:

an adder that is provided with an input spectral power signal and a first predetermined threshold value;

a first comparison element that receives the estimate of the power of the information signal and the first predetermined threshold value from the adder, wherein the first comparison element determines whether the estimate of the power of the information signal exceeds the first predetermined threshold value; and a second comparison element coupled to the first comparison element that determines whether a threshold value exceeds a second predetermined threshold value if the estimate of the power of the information signal exceeds the first predetermined threshold value, wherein if the threshold value exceeds the second predetermined threshold value then the pause is detected and the estimating means updates the previously made estimate of the noise power;

a second calculating means for calculating a modified gain for each frequency component as a function of the total power of each frequency component of the information signal, the estimate of the power of a previous noise reduced output and the updated estimate of the noise power; and gain multiplying means for multiplying each frequency component by a corresponding gain to produce an updated estimate of the power of each frequency component of said information signal.

13. The system as in claim 12 further comprising:

an increment element that increments the threshold value if the threshold value does not exceed the second predetermined threshold value.

14. The system as in claim 12 in which the second calculating means comprises:

means for estimating a Wiener gain from said updated estimate of the noise power and the estimated power of the previous noise reduced output;

Wiener multiplying means for multiplying said estimated Wiener gain by the ratio of the total power of each frequency component to the updated estimate of the noise power to produce an estimate of a signal to noise ratio for each frequency component of the set of frequency components;

function calculating means for calculating a function of the estimated signal to noise ratio; and division means for dividing said function of the estimated signal to noise ratio by the ratio of the total power of each frequency component to the updated estimate of the noise power to produce a modified gain.

15. The system of claim 12 wherein said means to produce a set of frequency components filters the input signal through a set of band pass filters.

16. The system of claim 12 wherein said means to produce a set of frequency components is capable of calculating the Fourier Transform of the input signal.

* * * * *